US011004839B1

(12) United States Patent
Deng et al.

(10) Patent No.: US 11,004,839 B1
(45) Date of Patent: May 11, 2021

(54) TRENCH POWER MOSFET WITH INTEGRATED-SCHOTTKY IN NON-ACTIVE AREA

(71) Applicant: Renesas Electronics America Inc., Milpitas, CA (US)

(72) Inventors: Shengling Deng, Chandler, AZ (US); Patrick Shea, Oviedo, FL (US)

(73) Assignee: Renesas Electronics America Inc., Milpitas, CA (US)

( * ) Notice: Subject to any disclaimer, the term of this patent is extended or adjusted under 35 U.S.C. 154(b) by 0 days.

(21) Appl. No.: 16/538,479

(22) Filed: Aug. 12, 2019

Related U.S. Application Data

(60) Provisional application No. 62/718,293, filed on Aug. 13, 2018.

(51) Int. Cl.
  *H01L 27/02* (2006.01)
  *H01L 29/78* (2006.01)
  *H01L 29/40* (2006.01)
  *H01L 29/66* (2006.01)
  *H01L 21/8234* (2006.01)

(52) U.S. Cl.
  CPC .. *H01L 27/0255* (2013.01); *H01L 21/823475* (2013.01); *H01L 27/0296* (2013.01); *H01L 29/407* (2013.01); *H01L 29/66727* (2013.01); *H01L 29/66734* (2013.01); *H01L 29/7806* (2013.01); *H01L 29/7811* (2013.01); *H01L 29/7813* (2013.01)

(58) Field of Classification Search
  CPC ............. H01L 27/0255; H01L 27/0296; H01L 29/66727; H01L 29/7806; H01L 29/7813; H01L 29/66734; H01L 21/823475; H01L 29/7811; H01L 29/407
  USPC .......................................................... 257/334
  See application file for complete search history.

(56) References Cited

U.S. PATENT DOCUMENTS

| 5,856,700 | A | 1/1999 | Woodbury |
| 7,745,878 | B2 | 6/2010 | Bhalla et al. |
| 8,372,717 | B2* | 2/2013 | Hsieh .................... H01L 29/407 438/270 |
| 8,492,225 | B2 | 7/2013 | Girdhar et al. |
| 8,564,024 | B2* | 10/2013 | Yedinak ............. H01L 29/0611 257/213 |
| 8,921,186 | B2 | 12/2014 | Shea et al. |
| 8,962,425 | B2 | 2/2015 | Shen et al. |

(Continued)

Primary Examiner — Vu A Vu
(74) Attorney, Agent, or Firm — Foley & Lardner LLP

(57) ABSTRACT

The present embodiments relate to an apparatus and method of integrating a semiconductor cell in a non-active area of a MOSFET on a semiconductor substrate. An active area of the MOSFET may include a regular MOSFET cell. The semiconductor cell which can have various structures is configured to function as trench MOS barrier Schottky (TMBS) diode. Depending on its structure the TMBS diode may be integrated in a termination region or a shield tie region or a gate finger neighboring region in the non-active area. The integrated TMBS diode as such can limit the body diode conduction and improve the conduction and switching efficiency in a circuit. Additionally, an integrated TMBS diode may improve the softness of reverse recovery of the MOSFET, reduce drain to source voltage overshoot and ringing due to softer recovery and/or shield bounce without wasting any active area of the semiconductor die of the MOSFET.

22 Claims, 10 Drawing Sheets

(56) References Cited

U.S. PATENT DOCUMENTS

| | | |
|---|---|---|
| 9,099,519 B2 | 8/2015 | Shen et al. |
| 9,209,173 B2 | 12/2015 | Hebert |
| 9,269,779 B2 | 2/2016 | Deng et al. |
| 9,530,883 B2 | 12/2016 | Deng et al. |
| 9,842,925 B2 | 12/2017 | Deng et al. |
| 2019/0123194 A1 | 4/2019 | Shea |

* cited by examiner

TRENCH POWER MOSFET WITH INTEGRATED-SCHOTTKY IN NON-ACTIVE AREA

CROSS-REFERENCE TO RELATED PATENT APPLICATIONS

This application claims priority from U.S. Provisional Patent Application No. 62/718,293, filed Aug. 13, 2018, incorporated herein by reference in its entirety.

TECHNICAL FIELD

The present embodiments relate generally to semiconductor devices and more particularly to novel power MOSFET devices, including insulated gate devices and structures.

BACKGROUND

Insulated gate field effect transistors (IGFETs), such as metal oxide semiconductor field effect transistors (MOSFETs), have been used in many power switching applications, such as dc-dc converters.

In a typical form, a MOSFET structure includes active and non-active areas. The active areas typically include a plurality of active cells formed by source regions, source terminals, gate regions, gate terminals, drain regions, drain terminals, body regions, shield regions, and other regions that are necessary for it to function as a transistor. The non-active areas typically include termination regions, shield tie regions, gate finger regions, also referred to as gate feed regions, gate finger neighboring regions, and other supporting connections necessary for the active cells. Any two neighboring active areas are separated by non-active areas.

In a typical MOSFET, a gate electrode provides turn-on and turn-off control with the application of an appropriate gate voltage. By way of example, in an n-type enhancement mode MOSFET, turn-on occurs when a conductive n-type inversion layer (i.e., channel region) is formed in a p-type body region in response to the application of a positive gate voltage, which exceeds an inherent threshold voltage. The inversion layer connects n-type source regions to n-type drain regions and allows for majority carrier conduction between these regions.

Due to their construction, MOSFETs have an intrinsic body diode between the source and the drain. For example, in an n-channel enhancement mode MOSFET, the body diode is formed between the p+ well of the source and the n− region of drain.

More particularly, the body diode conduction, or commutation, is from the source to the drain while the MOSFET is turned off and a forward bias Vsd is applied between the source and the drain. The body diode leakage is from the drain to the source while the MOSFET is in off state and a high voltage Vds is sustained between drain and source.

The intrinsic body diode is desirable when the MOSFET is used as a 'Sync FET' (or 'Low-side FET') in a DC-DC converter, as it eliminates the need for an external freewheeling diode. However, the body diode usually has a higher forward voltage (Vf) and a higher reverse recovery charge (Qrr) compared to the Schottky diode.

Past efforts to reduce the above mentioned drawbacks in trench MOSFETs include integrating a Schottky barrier diode at the bottom of the source trenches or opening up the bottom of source trenches into the p-epi or n-epi region below the source region which is an active area of the MOSFET. Specifically, a Schottky barrier diode is incorporated by depositing a metal layer on the walls and at the bottom of source contact trenches. This type of configuration creates an ohmic contact between the side walls of source trenches and the surrounding semiconductor region; and a Schottky contact between the bottom portion of the source trenches and the semiconductor region underneath the same, which is an active area of the semiconductor. The Schottky barrier diode formed in this way helps reduce diode conduction loss and reverse recovery loss, at the cost of active area loss.

Thus, it would be advantageous to have a MOSFET device configuration that has lower forward voltage (Vf) and a lower reverse recovery charge (Qrr) without having to waste any space in the active area.

SUMMARY

The present embodiments provide a solution for placing/integrating/Schottky barrier diodes in the non-active areas of a MOSFET structure or a plurality of MOSFET structures.

This configuration results in a lower conduction loss and an ultra-low reverse-recovery charge and soft recovery during MOSFET switching. It can significantly improve MOSFET switching efficiency, leading to more robust device performance. Unlike an integrated-Schottky approach, the proposed structure does not use the active area for the Schottky, thus not suffering from Rdson penalty.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein.

DETAILED DESCRIPTION

Figure 1:
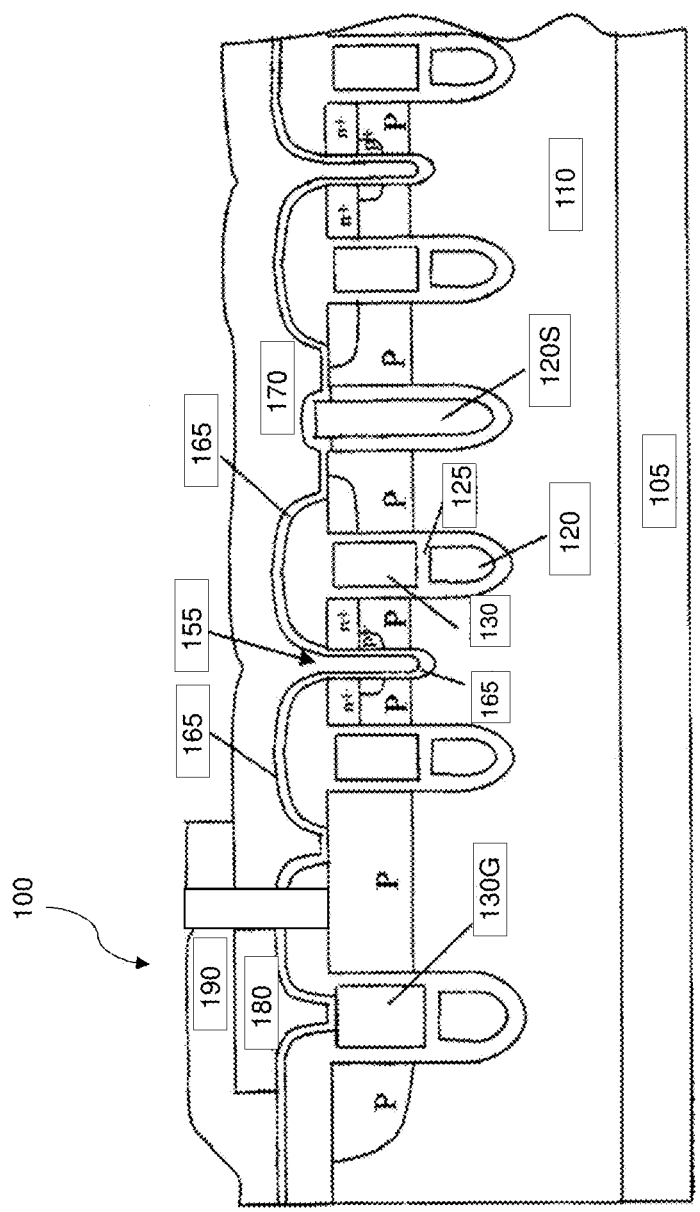
FIG. 1 illustrates a partial vertical cross-sectional view of an example semiconductor trench MOSFET according to a standard configuration.

The present embodiments will now be described in detail with reference to the drawings, which are provided as illustrative examples of the embodiments so as to enable those skilled in the art to practice the embodiments and alternatives apparent to those skilled in the art. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments will be described, and detailed descriptions of other portions of such known components will be omitted so as not to obscure the present embodiments. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

For simplicity and clarity of illustration, elements in the figures are not necessarily drawn to scale, and the same reference numbers in different figures denote generally the same elements. Additionally, numerals for similar portions in the figures, have been shown when necessary to understand the description. Additionally, descriptions and details of well-known steps and elements may be omitted for simplicity of the description. As used herein, current-carrying electrode means an element of a device that carries current through the device, such as a source or a drain of an MOS transistor, an emitter or a collector of a bipolar transistor, or a cathode or anode of a diode, and a control electrode means an element of the device that controls current through the device, such as a gate of a MOS transistor or a base of a bipolar transistor.

Although the devices are explained herein as certain n-channel devices, a person of ordinary skill in the art understands that p-channel devices and complementary devices are also possible in accordance with the present description. For clarity of the drawings, doped regions of device structures can be illustrated as having generally straight-line edges and precise angular corners; however, those skilled in the art understand that due to the diffusion and activation of dopants, the edges of doped regions are generally not straight lines and the corners are not precise angles. It may be appreciated by those skilled in the art that the semiconductor devices and structures, in this specification may be created by any existing standard doping methods MOSFETs or trench MOSFETs. More specifically, the n+, p+, p-body layers or regions may be created by an ion implantation method. The n-epitaxial (n-epi) layer may be created using an epitaxial growth.

Furthermore, the term "major surface" when used in conjunction with a semiconductor region or substrate means a surface of the semiconductor region or substrate that forms an interface with another material, such as a dielectric, an insulator, a conductor, or a polycrystalline semiconductor. The major surface can have a topography that changes in the x, y and z directions.

In the present specification the term "semiconductor device" may be alternately used with the term "MOSFET". "MOSFET" may be alternately used with "active cell".

In addition, structures of the present description can embody either a cellular-base design (in which the body regions are a plurality of distinct and separate cellular or stripe regions) or a single-base design (in which the body region is a single region formed in an elongated pattern, typically in a serpentine pattern or a central portion with connected appendages). However, one embodiment of the present description will be described as a cellular base design throughout the description for ease of understanding. It should be understood that the present disclosure encompasses both a cellular-base design and a single-base design.

In general, one skilled in the art can appreciate that an insulated gate semiconductor device structure according to an embodiment may comprise a region of semiconductor including a semiconductor substrate, a first semiconductor layer of a first conductivity type and a first dopant concentration on the semiconductor substrate, and a second semiconductor layer on the first semiconductor layer, the second semiconductor layer having the first conductivity type, having a second dopant concentration greater than the first dopant concentration, and having a major surface. The structure includes a body region of a second conductivity type in the second semiconductor layer extending from the major surface. The structure includes a trench structure in the first semiconductor layer and the second semiconductor layer extending from the major Surface adjacent the body region. The trench structure comprises a trench terminating with the first semiconductor layer, an insulated gate electrode and an insulated shield electrode below the insulated gate electrode. A source region of the first conductivity type in the body region is adjacent the trench structure. A doped region of the second conductivity type is in the second semiconductor layer adjacent a lower surface of the body region, wherein a portion of the second semiconductor layer separates the doped region from the trench structure.

In one embodiment, the device can include a semiconductor substrate, a first layer of a first dopant concentration on the semiconductor substrate, a second layer of a second dopant concentration on the first layer, an insulated trench gate electrode and an insulated trench source electrode. In some embodiments, the trench structure includes a notch or indentation proximate to a body region of the device. In other embodiments, the device can include a localized doped region or regions adjacent to a lower surface of the body region but spaced apart from the trench structure where the doped region has an opposite conductivity type to the second semiconductor layer. In other embodiments, the device can include a doped region adjacent the body region of the device and trench structure where the body region has the same conductivity type as the second semiconductor layer but a higher dopant concentration. In some embodiments, the device can include all of the described features. In some embodiments, the device can include at least one of the described features. In other embodiments, the device can include at least two of the described features. In further embodiments, the device can include at least three of the described features. In still further embodiments, the device can include at least four of the described features. It should be understood that the illustrated embodiments are exemplary only, and should not be taken as limiting the scope of the invention.

An integrated semiconductor device constructed as such may have an improved performance. It may have substantially the same or even greater breakdown voltage ($B_{VDSS}$) than a regular MOSFET or a regular TMOS. It may also reduce the conduction and/or switching losses, and/or improve switching waveforms in a circuit. Furthermore, it may withstand a higher drain to source current ($I_{DSS}$) over a range of drain to source voltage ($V_D$s) than a regular MOSFET or a regular TMOS. In general, the present embodiments relate to an improved insulated gate semiconductor device structure and a method of manufacture of the same. The insulated gate semiconductor device described herein is a power MOSFET and more particularly a trench power MOSFET, although the embodiments described can be suitable for any other type of insulated gate semiconductor device structure. Hereafter, the terms MOSFET or trench MOSFET or power MOSFET may be alternately used in the specification.

The present embodiments provide improvements to a basic MOSFET structure. The basic MOSFET structure may be a conventional one, comprising active and non-active areas as explained earlier in the background. The present embodiments propose an improvement to the basic trench MOSFET structure by integration of additional semiconductor devices in the non-active areas. In some embodiments the semiconductor devices are Schottky barrier diodes. As the examples herein are described with respect trench MOSFETs, the Schottky barrier diodes may also be referred to as Trench MOS Barrier Schottky (TMBS) diodes or the purpose of this specification.

In a first aspect, TMBS diodes are integrated in non-active areas of the MOSFET structure.

In a second aspect, various structures of TMBS diodes integrated into the non-active areas of trench MOSFETs are shown according to example embodiments. In one example, the Schottky barrier diodes have a similar structure as that of the MOSFET, but are configured to operate as diodes.

In various embodiments, the TMBS diodes are integrated in the termination regions or shield tie regions or gate finger (or gate feed) neighboring regions of the MOSFET layout. In some other examples, the TMBS diodes may also be integrated into gate finger regions. [Inventor: Please confirm if the TMBS diodes can also be integrated in gate finger regions No, we can NOT do it in gate finger.]. The TMBS diodes can limit the body diode conduction and thus improve conduction and switching efficiency in a circuit.

An integrated TMBS diode in the non-active areas may improve the softness of reverse recovery of the MOSFET. It can reduce Vas overshoot and ringing due to softer recovery and/or can also reduce shield bounce. As the TMBSs are integrated in the non-active areas (areas) and merge with the termination regions and shield tie regions, and gate finger neighboring regions, there is no waste of MOSFET active areas.

Furthermore, if necessary, the integrated TMBS diode according to some embodiments can also serve as a clamping diode to protect the active MOSFET cells in a reverse blocking mode. In one embodiment, the device can include a semiconductor substrate, a first layer of a first dopant concentration on the semiconductor substrate, a second layer of a second dopant concentration on the first layer, an insulated trench gate electrode and an insulated trench source electrode. It should be understood that the illustrated embodiments are exemplary only, and should not be taken as limiting the scope of the disclosure.

FIG. 1 illustrates a partial vertical cross-sectional view of an example semiconductor trench MOSFET 100 according to an existing configuration. As shown, the MOSFET 100 may include an n+ substrate (drain) region 105, an n epitaxial layer on the substrate, source contact trenches 155, source trenches 120S, source metal 170, a metal layer 165 in the source trenches, a gate region 130, a gate runner 130G, gate metal 180, a shield region 120, and a passivation layer 190.

Figures 2A, 2B:
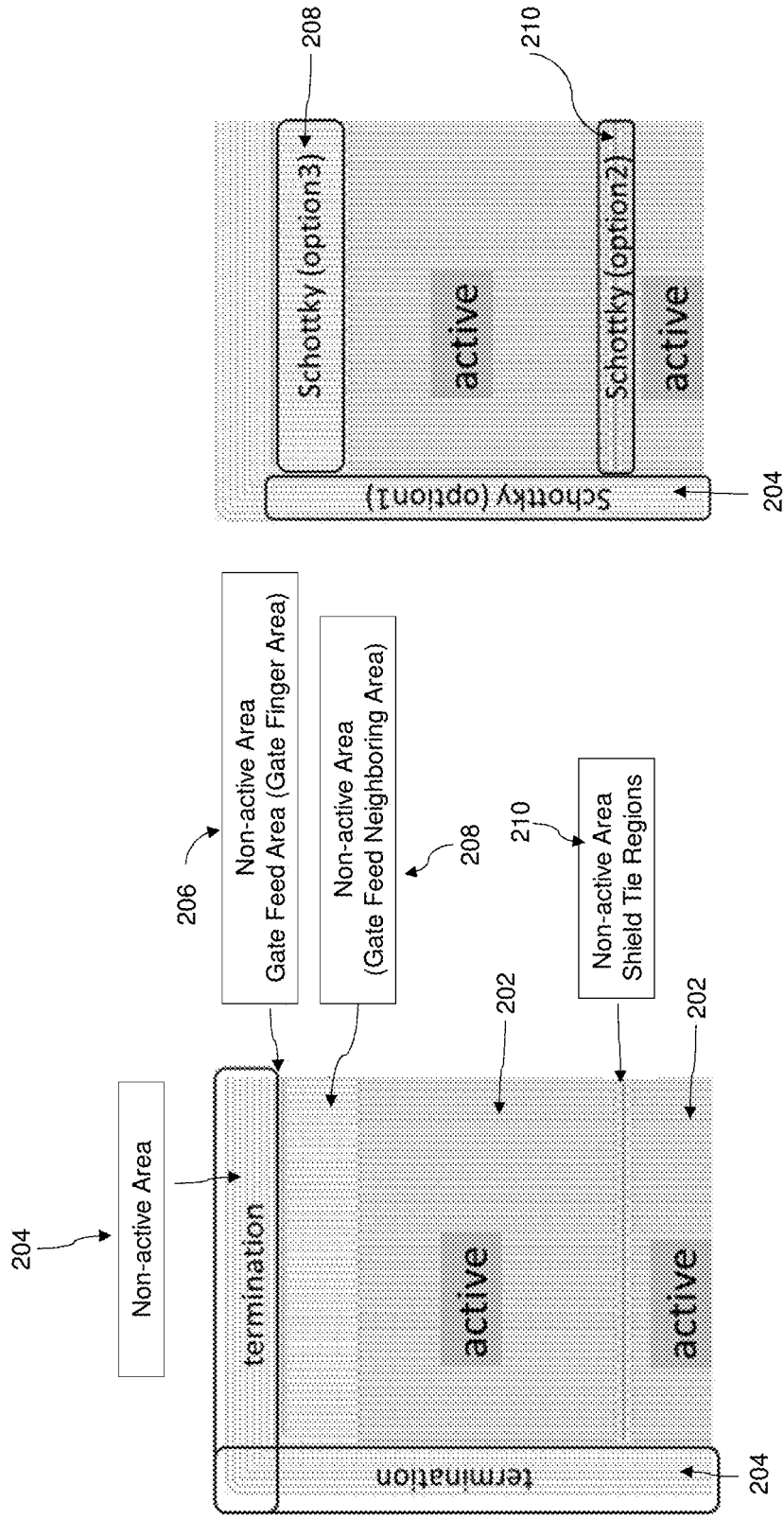
FIG. 2A illustrates an example partial top view of a trench MOSFET layout including active and non-active areas.
FIG. 2B illustrates example options for locations of integrated Schottky barrier diodes in various regions of the MOSFET layout of FIG. 2B.

FIG. 2A illustrates an example partial top view of a trench MOSFET layout including active area 202 and non-active area 204 which are the termination regions, 206 which are the gate feed or gate finger regions, 208 which are the gate feed neighboring regions, and 210 which are the shield tie regions. The active areas may include active cells. In one example, an active cell may have a conventional MOSFET structure including a drain region of a first conductivity type (e.g., n+) on the substrate, an epitaxial layer of the first conductivity type (e.g., n−) grown on the drain, a body region of a second conductivity type (e.g., p) formed in the epitaxial layer, a semiconductor layer of the second conductivity type (e.g., n+) in the body region, a trench source region having sidewalls and a bottom, localized doped regions of first conductivity type (p+) underneath the source regions in the body region, a trench gate region having sidewalls and a bottom, a shield region, gate oxide layer, and shield oxide layer. In other examples, the conductivity types may vary.

FIG. 2B illustrates example locations options of integrated Schottky barrier diodes in various non-active areas of the MOSFET layout of FIG. 2B. As can be see the location (Schottky option 1) is in the termination regions 204, the location (Schottky option 2) is in the shield tie regions 210, and the location (Schottky option 3) is in the gate finger neighboring regions 208.

Figure 3:
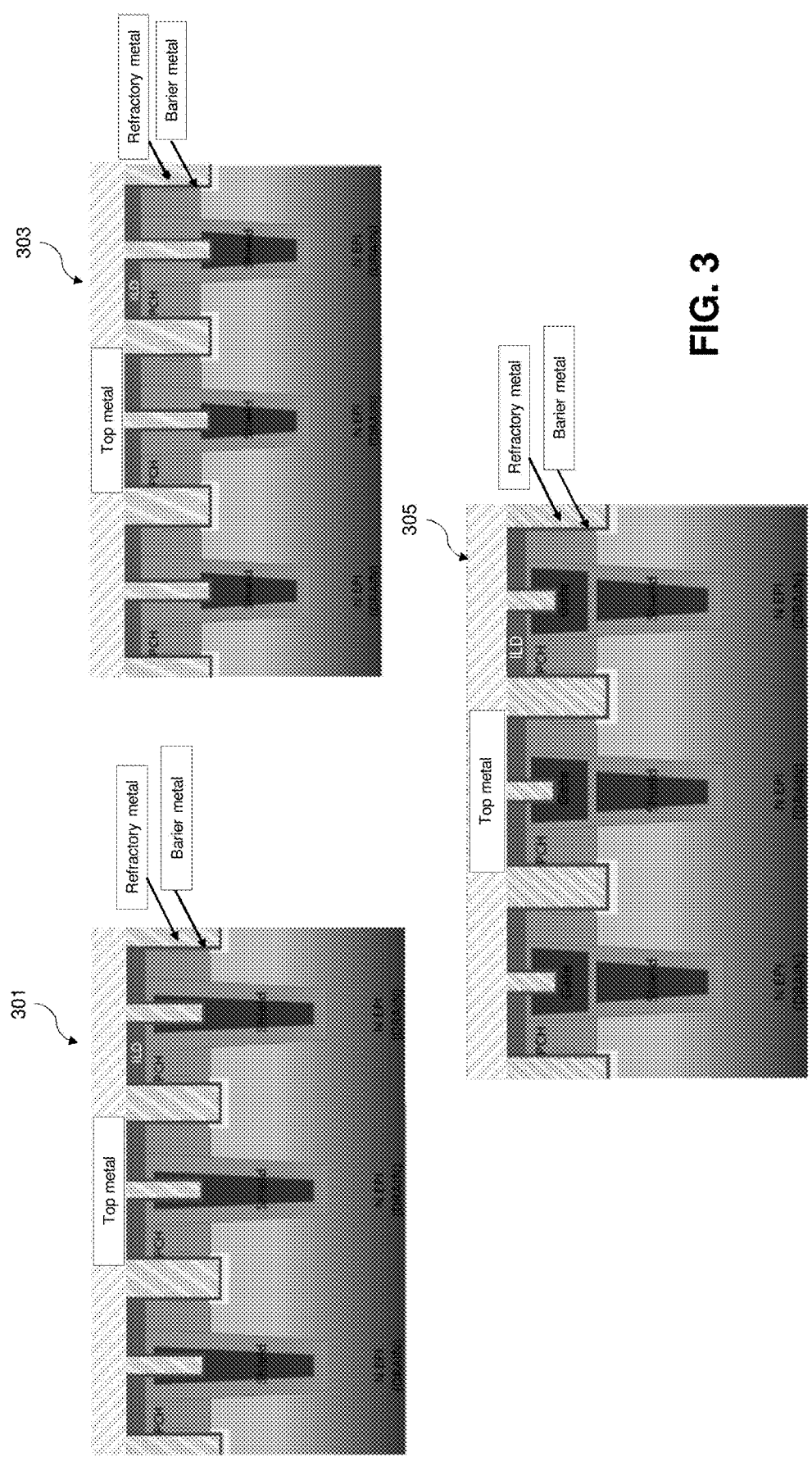
FIG. 3 illustrates example cross-sectional views 302, 304, and 306 of an integrated Schottky barrier diode for the location option 1, 2, and 3 of FIG. 2B.

FIG. 3 illustrates example cross-sectional views 301, 303, and 305 of an integrated Schottky barrier diode for various locations respectively of FIG. 2B. The cross-sections 301 and 303 may be integrated in termination regions 204 or shield tie regions 210. The cross-sections 305 may be integrated in the gate finger neighboring regions 208. The cross-sectional views 301, 303, and 305 generally are shown to comprise a trenches, drain regions, n-epi regions, shield regions, gate regions, a top metal, a refractory metal, and a barrier metal. The above mentioned cross-sectional views will be discussed in more details in the following paragraphs.

Figure 4:
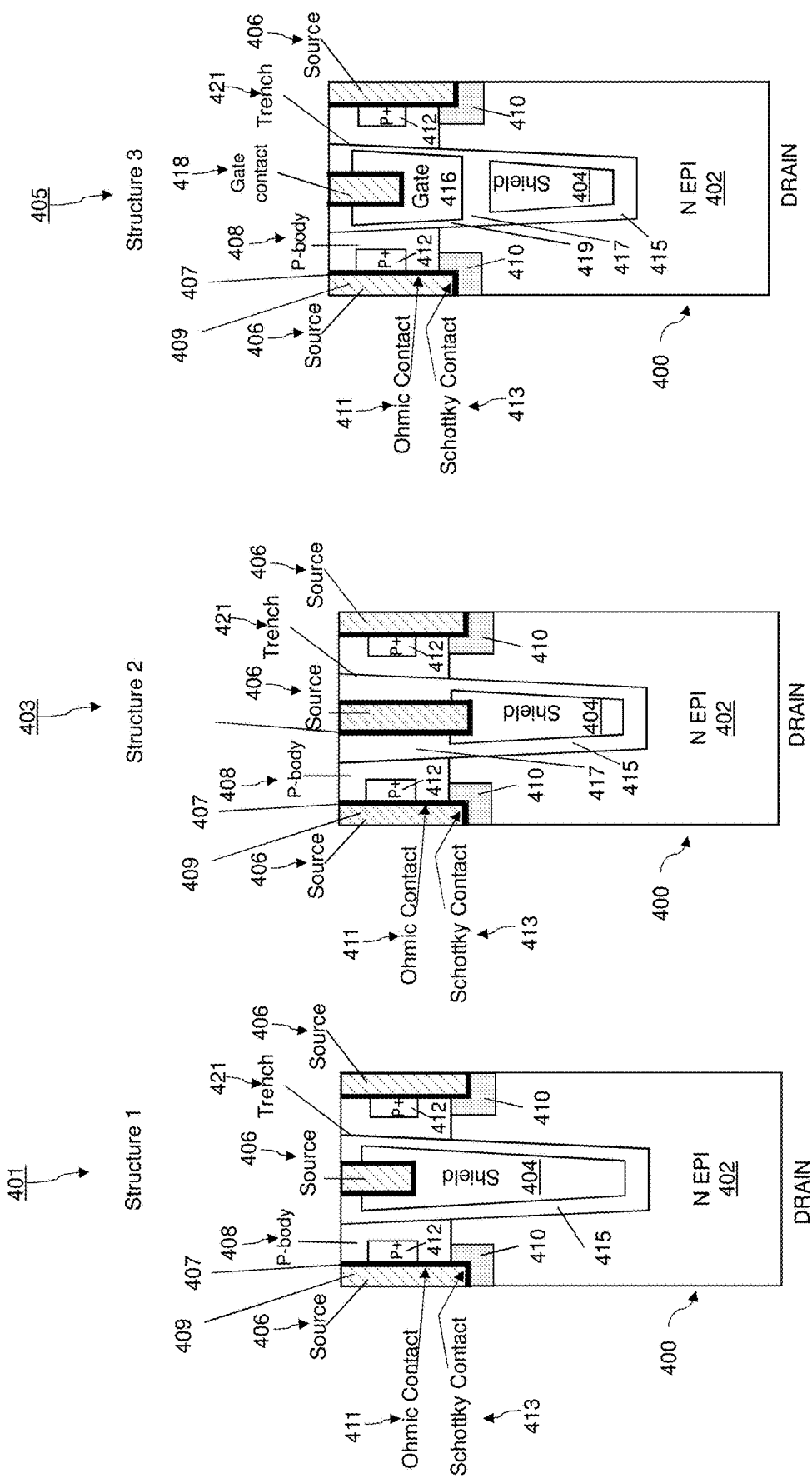
FIG. 4 illustrates example cross-sectional views of various structures of a Schottky barrier diode according to various embodiments of the present disclosure.

FIG. 4 illustrates examples cross-sectional views 401, 403, and 405 of structures of Schottky barrier diodes according to various embodiments. The structure 401 shows details of a single TMBS of 301. The structure 403 further shows details of a single TMBS of 303. The structure 405 shows details of a single TMBS of 305. In all the structures 401, 403, and 405, the diodes may have some common portions such as a trench region 421, drift region 402, source contacts 406, shield poly 404, p-body regions 408, p+ regions 412, and lightly doped n region 410.

More particularly, in one example, the diodes shown in 401, 403, and 405 may be formed on an "n" type substrate (not shown). The drift region 402 may be expitaxially grown on the substrate. In one example, the lightly doped n region 410 may be formed by difluoroborane (BF2) or Boron counter-doping.

The p-body region 408 is formed on top of the n-epi layer 402. The p+ regions 412 are also formed within the p-body 408 near the source contacts 406. As may be appreciated, the p+ regions 412 has a higher dopant concentration than p-body region 408.

The structures 401, 403, and 405 are different in the following aspects. In structure 401, the diode may have a regular shield poly 404. In the structure 403 the diode may have a recessed shield poly 404. In the structure 405 the diode may have a split-gate configuration that comprises a gate poly 416 and a shield poly 404.

Additionally, in the structure 401, the shield poly 404 is surrounded by a shield oxide 415. In the structure 403, the shield poly 404 is surrounded by the shield oxide 415 and there is also oxide 417 over the shield poly 404. In the structure 405, the shield poly 404 is surrounded by the shield oxide 415, the gate poly 416 is surrounded by a gate oxide 419, and there is also inter-poly oxide 417 between the gate poly 416 and the shield poly 404. There are a plurality of metal layers (indicated by the shaded potions 407 and 409) deposited in the source contacts 406. In one example, there is a thinner barrier metal layer 407 followed by a thicker refractory metal layer 409. In one example, the barrier metal layer 407 can be of titanium/titanium nitride (Ti/TiN) and the refractory metal layer 409 can be of tungsten (W). In one example, the Schottky barrier is formed between the barrier metal layer 407 and the lightly doped silicon 410. Further, in the structures 401 and 403, the shield poly 404 and the source contacts 406 are both connected to the source terminals in the active areas 202 referred to in FIG. 2A. In the structure 405, the gate poly 416 is connected to the gate contact 418. The gate poly 416 is separated from the shield poly 404. There are also metal layers 407 and 409 which fills the gate contact 418.

As shown the metal layers 407, 409 in the source contacts 406 form an Ohmic contact 411 on the sidewalls of the source contacts 406 and the p+ regions 412; and a Schottky contact 413 at the bottom of the source contacts 406.

Referring back to FIG. 3, in some embodiments, structure 401 may be suitable to be integrated into the termination region 206 and the shield tie region 208; the structure 403 may be suitable to be integrated into the termination region 206; and the structure 405 may be suitable to be integrated into the gate finger neighboring area 210.

Figure 5:
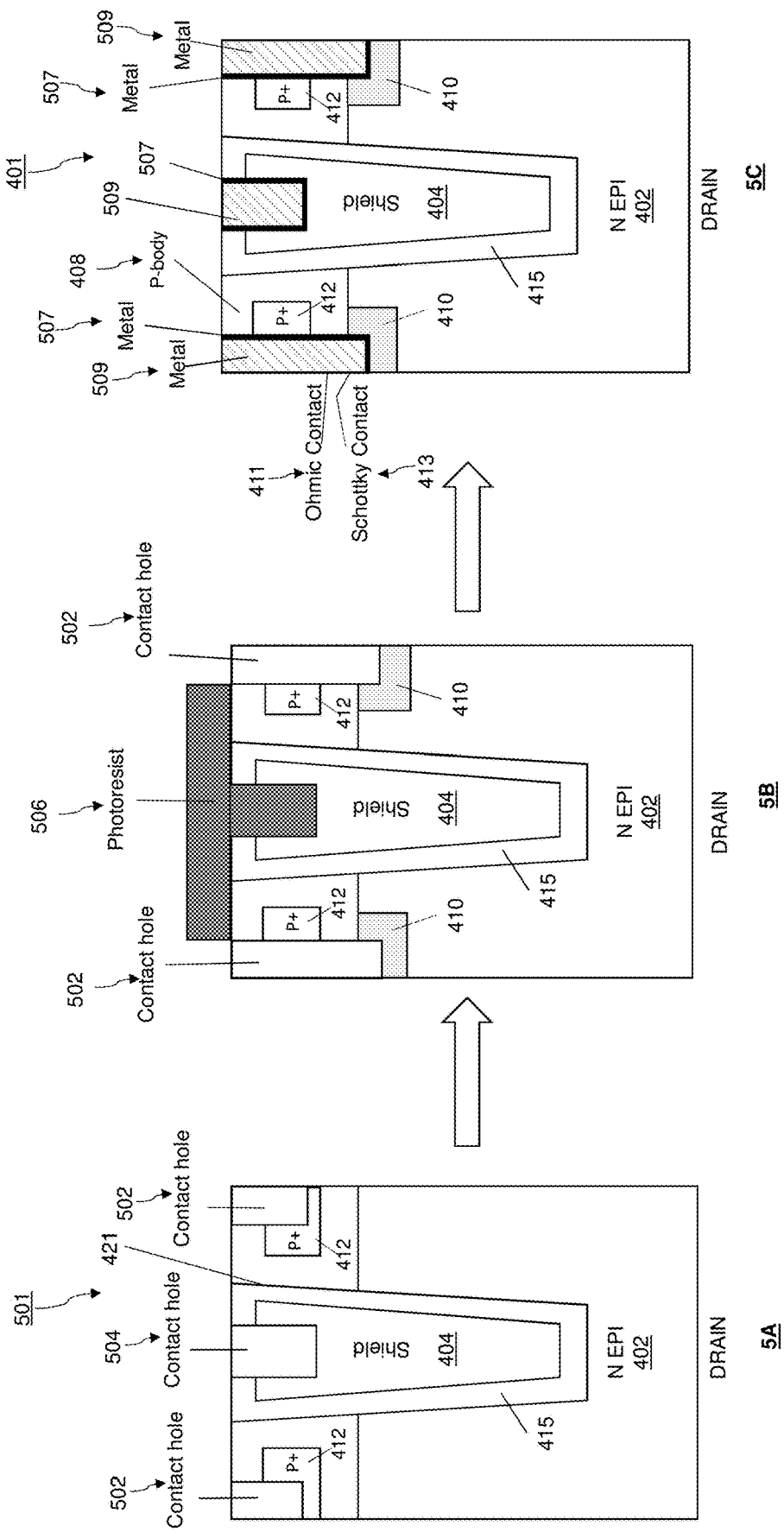
FIG. 5 illustrates an example partial process flow of integrating a first structure of a Schottky barrier diode shown in FIG. 4 according to an embodiment of the present disclosure.

FIG. 5 illustrates an example process flow of integrating the structure 401 of the diode 400 shown in FIG. 4 according to an embodiment. In one example, the method includes major steps 5A, 5B, and 5C. Before 5A, it may be assumed that a series of process steps have been completed to form the trench 421, the shield oxide 415, shield poly 404, p-body 408, and p+ region 412 in the designated Schottky diode area.

At 5A, source contact holes 502 on the mesa regions of the diode 400 and another shield contact hole 504 over the shield poly 404 are formed. In one example, the shield contact hole 504 may be formed by normal silicon etching and may be etched together with the source contact holes 502.

At 5B, a mask may be used to pattern the photoresist 506 to selectively expose the source contact holes 502. After that the contact holes 502 may be further deepened by etching. Furthermore, lightly doped n region 410 may be formed underneath the contact holes 502 by counter doping the n-epi using BF2 or Boron implant.

At 5C, the photoresist is removed and metal layers 507 and 509 are deposited in the source contact holes 502 and 506 (not shown in 5C), which results in the structure 401 as shown in FIG. 4.

Figure 6:
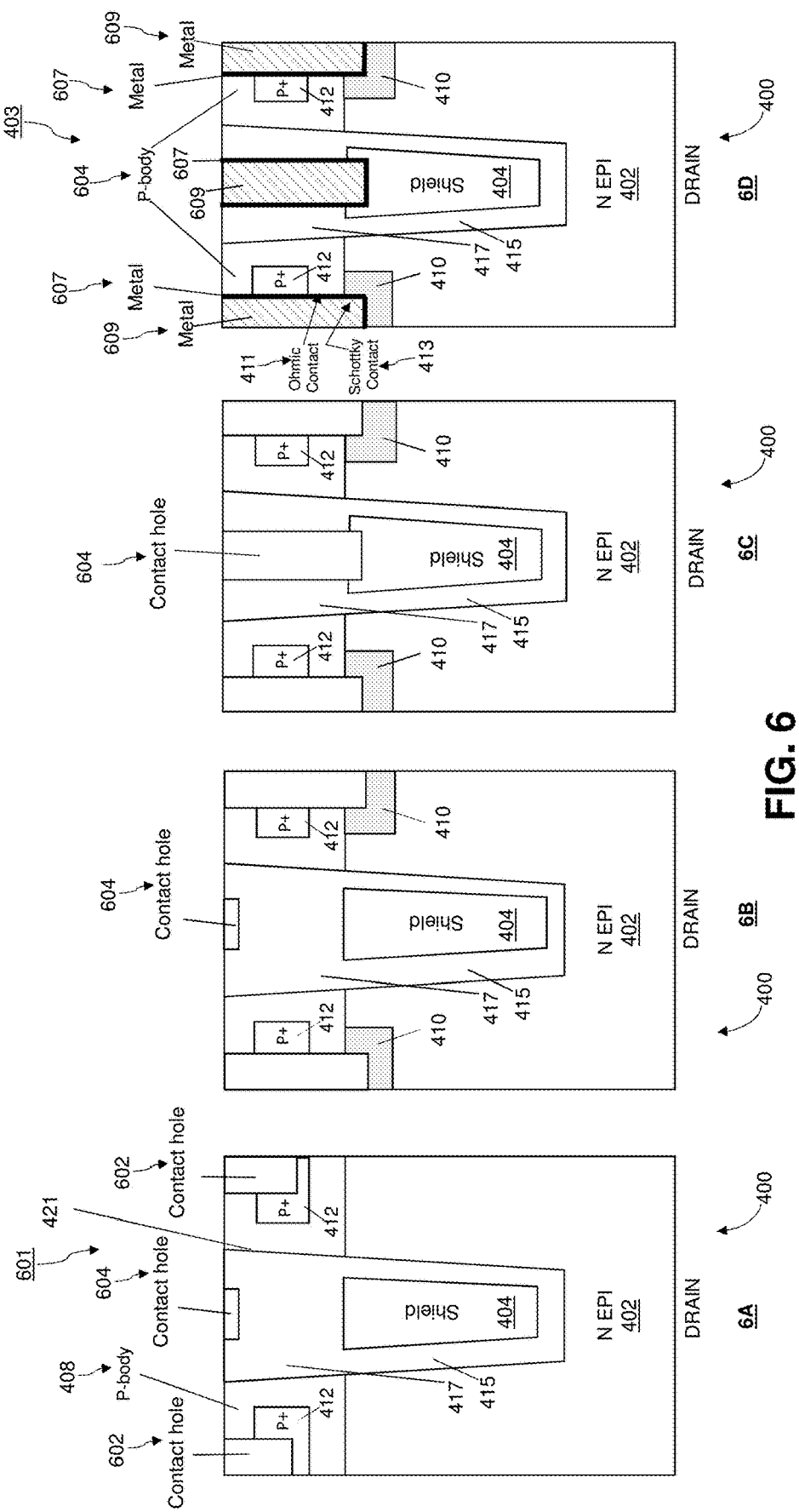
FIG. 6 illustrates an example partial process flow of integrating a second structure of a Schottky barrier diode shown in FIG. 4 according to an embodiment of the present disclosure.

FIG. 6 illustrates an example process flow of integrating the structure 403 shown in FIG. 4 according to an embodiment. In one example, the method includes major steps 6A, 6B, 6C, and 6D. Before 6A, it may be assumed that a series of process steps have been completed to form the trench 421, the shield oxide 415, shield poly 404, inter-poly oxide 417, p-body 408, and p+ region 412 in the designated Schottky diode area.

At 6A, the contact holes 602 on the mesa regions of the diode 400 and a shield contact hole 604 over the shield poly 404 are formed. In one example, before creating the contact holes 602, a very shallow shield contact hole 604 is created in the oxide 417 by over etching the inter-layer dielectric (ILD) (not shown). After this the contact holes 602 are created by silicon etching, but the shield contact hole 604 will not be deepened due to etching selectivity.

At 6B, a photoresist layer (not shown) is deposited and patterned to expose the entire Schottky diode area, and the contact holes 602 may be further deepened by silicon etching. Furthermore, lightly doped n region 410 may be formed underneath the contact holes 602 by counter doping the n-epi region.

At 6C, the shield contact hole is 604 is deepened by oxide etching to penetrate the shield poly 404.

At 6D, metal layers 607 and 609 are deposited in the contact holes 602 and 604 (not shown in 6C), which results in the structure 403 as shown in FIG. 4.

Figure 7:
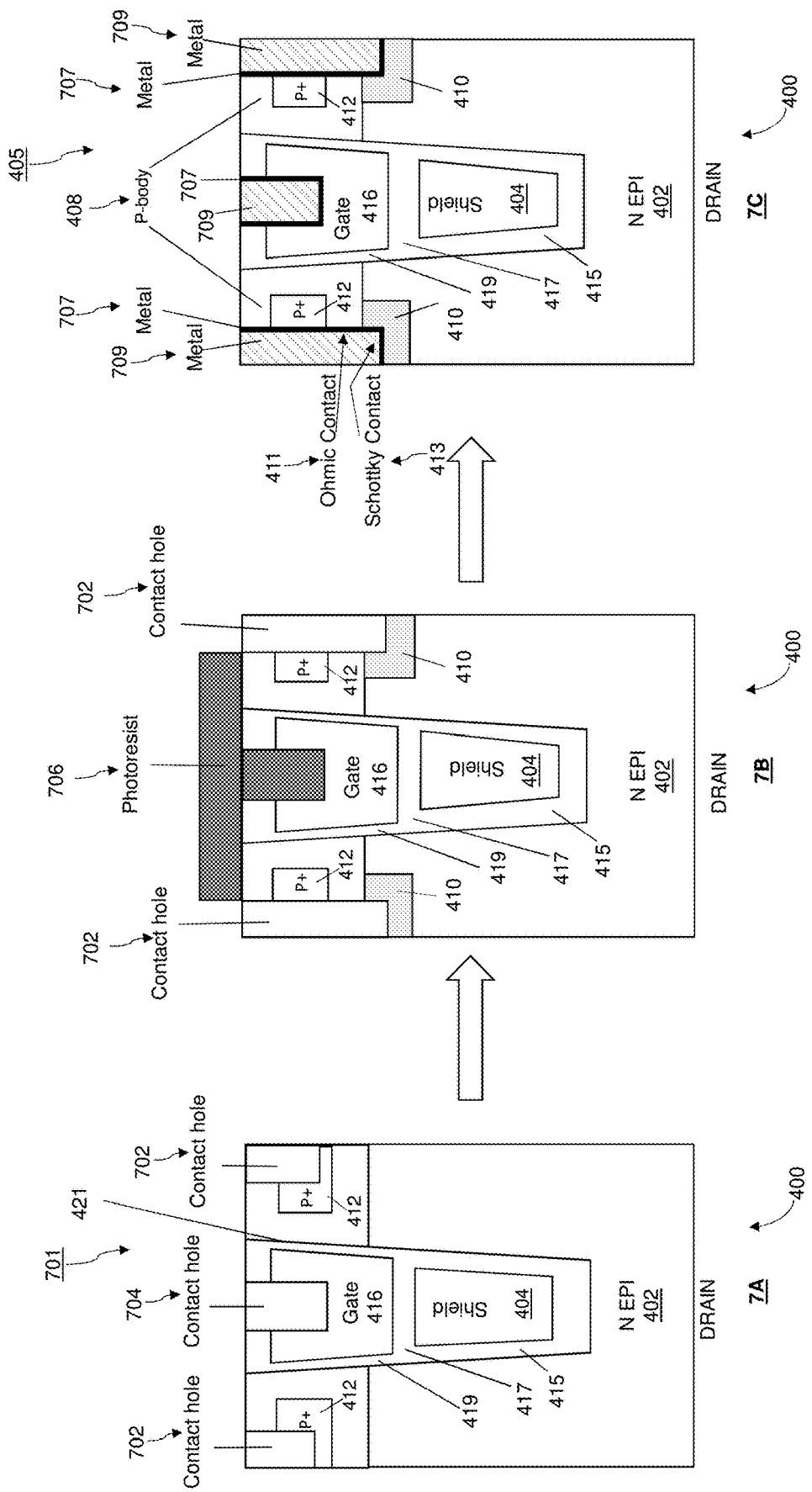
FIG. 7 illustrates an example partial process flow of integrating a third structure of a Schottky barrier diode shown in FIG. 4 according to an embodiment of the present disclosure.

FIG. 7 illustrates an example process flow of integrating the structure 405 shown in FIG. 4 according to an embodiment. In one example, the method includes major steps 7A, 7B, and 7C. Before 7A, it may be assumed that a series of process steps have been completed to form the trench 421, shield oxide 415, shield poly 404, inter-poly oxide 417, gate poly 416, gate oxide 419, p-body 408, and P+ region 412 in the designated Schottky diode area.

At 7A, source contact holes 702 on the mesa regions of the diode 400 and a gate contact hole 704 over the gate poly 416 are formed. In one example, the gate contact hole 704 may be formed by normal silicon etching and may be etched together with the source contact holes 702.

At 7B, a mask may be used to pattern the photoresist 706 to selectively expose the source contact holes 702. After that the source contact holes 702 may be further deepened by etching. Furthermore, lightly doped n region 410 may be formed underneath the contact holes 702 by counter doping the n-epi region.

At 7C, the photoresist 706 is removed and metal layers 707 and 709 are deposited in the source contact holes 702 and the gate contact hole 706 (not shown in 7C), which results in the structure 405 as shown in FIG. 4.

Figure 8:
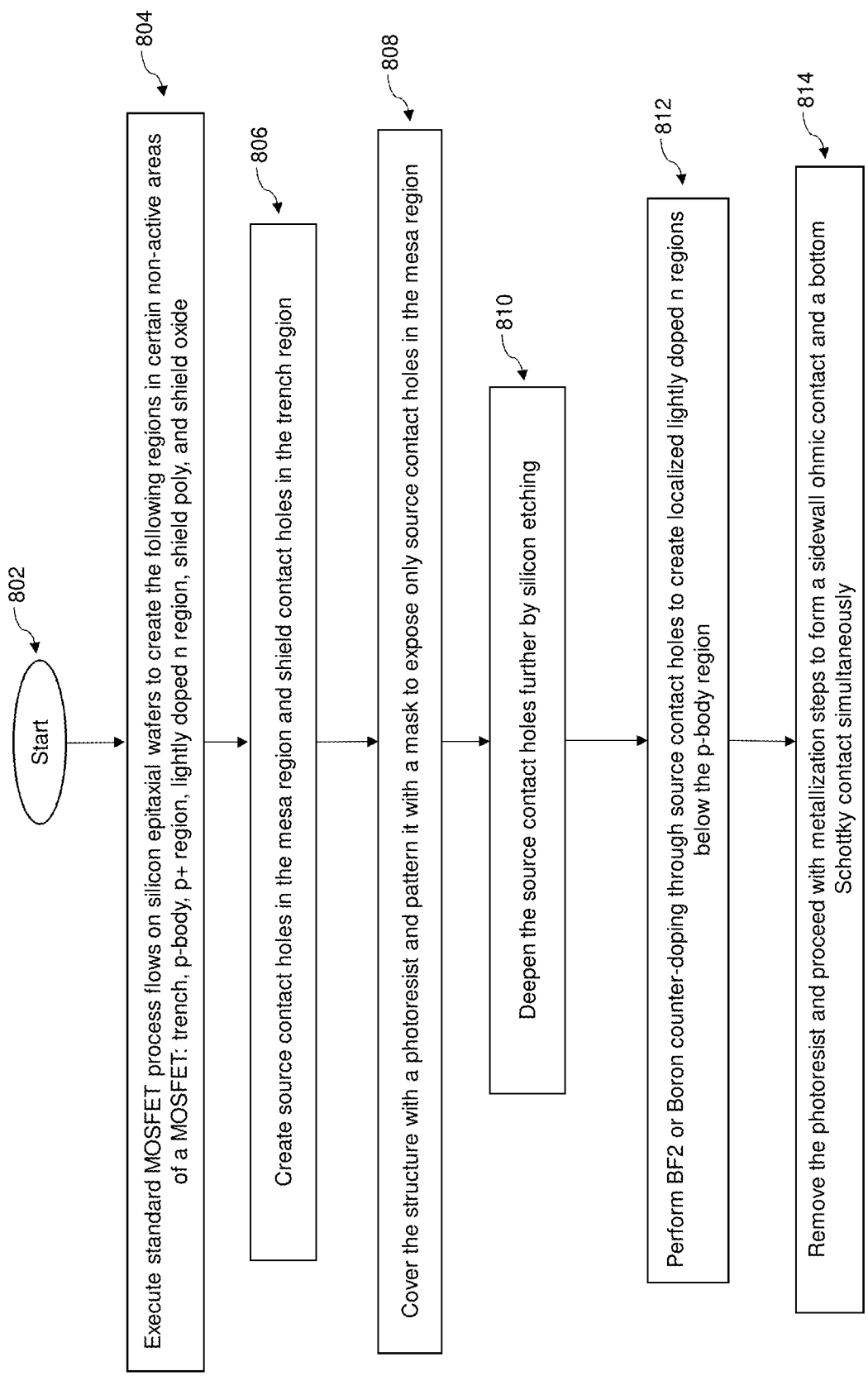
FIG. 8 is a flowchart illustrating an example method of integrating a first structure of a Schottky barrier diode shown in FIG. 4 according to an embodiment of the present disclosure.

FIG. 8 is a flowchart illustrating an example method of integrating a Schottky barrier diode according to the first structure 401 as shown in FIG. 5 according to an embodiment.

In one example, after starting at block 802, the process may proceed to the block 804 where standard MOSFET process flows may be executed on silicon epitaxial wafers to create the following regions in certain non-active areas of a MOSFET: trench, p-body, p+ region, lightly doped n region, shield poly, and shield oxide, as described with respect to FIG. 5. After that the process proceeds to block 806.

At block 806, the source contact holes may be created in the mesa region and shield contact holes may be created in the trench region, after which the process proceeds to block 808.

At 808, the structure may be covered with a photoresist and patterned with a mask to expose only source contact holes in the mesa region, after which the process proceeds to block 810.

At block 810, the source contact holes may be deepened by further silicon etching, after which the process proceeds to block 812.

At block 812, BF2 or Boron counter-doping may be performed through source contact holes to create localized lightly doped n regions below the p-body region, after which the process proceeds to block 814.

At block 814, the photoresist may be removed to proceed with metallization steps to form a sidewall ohmic contact and a bottom Schottky contact simultaneously.

Figure 9:
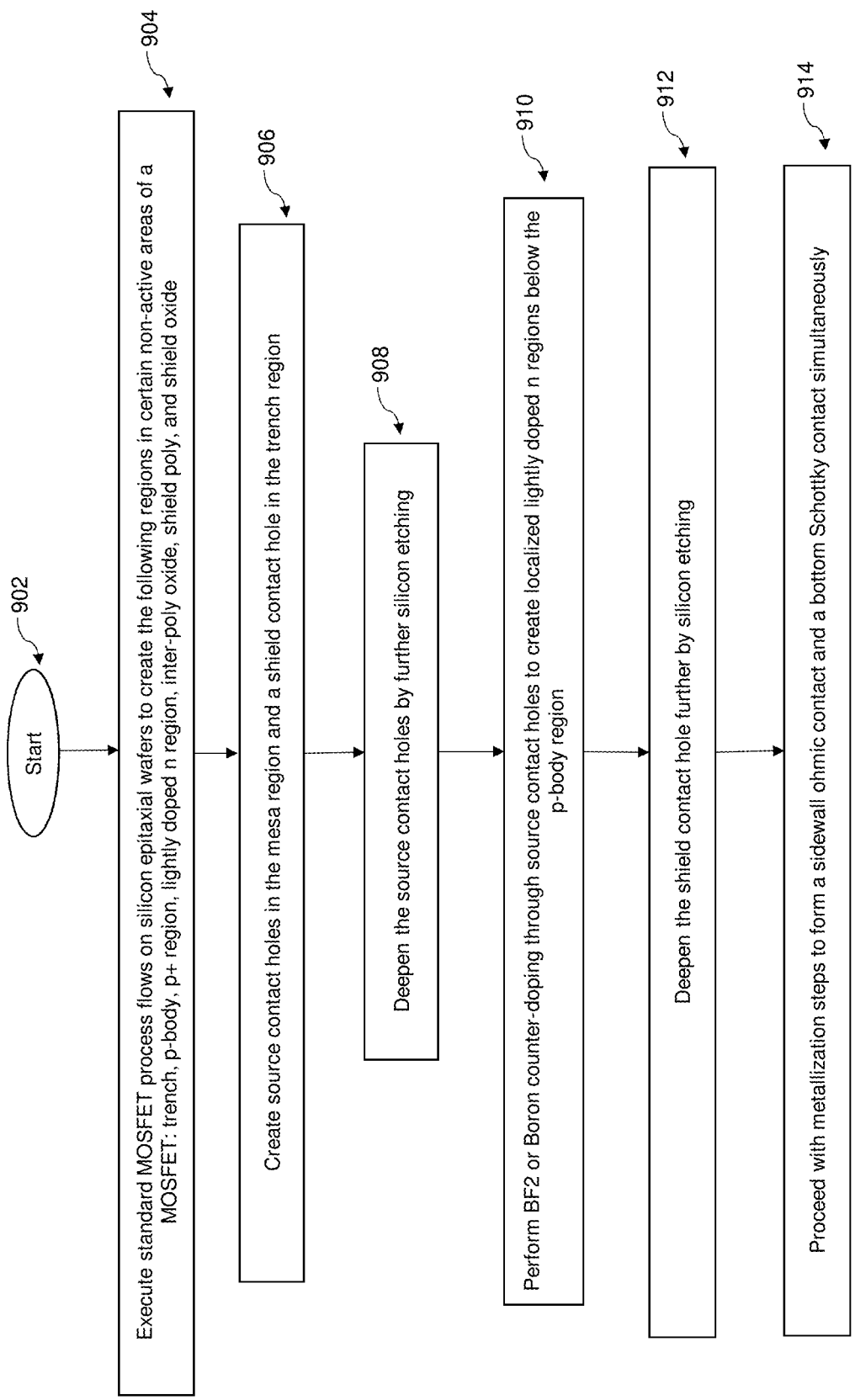
FIG. 9 is a flowchart illustrating an example method of integrating a second structure of a Schottky barrier diode shown in FIG. 4 according to an embodiment of the present disclosure.

FIG. 9 is a flowchart illustrating an example method of integrating the Schottky barrier diode according to the second structure 403 as shown in FIG. 6 according to an embodiment.

In one example, after starting at block 902, the process may proceed to the block 904 where standard MOSFET process flows may be executed on silicon epitaxial wafers to create the following regions in certain non-active areas of a MOSFET: trench, p-body, p+ region, lightly doped n region, inter-poly oxide, shield poly, and shield oxide, as described with respect to FIG. 6. After that the process proceeds to block 906.

At block 906, the source contact holes may be created in the mesa region and shield contact holes may be created in the trench region, after which the process proceeds to block 908.

At block 908, the source contact holes may be deepened further by silicon etching, after which the process proceeds to block 910.

At block 910, BF2 or Boron counter-doping may be performed through source contact holes to create localized lightly doped n regions below the p-body region, after which the process proceeds to block 912.

At block 912, the source contact hole over the recessed shield region may be deepened further by silicon etching, after which the process proceeds to block 914.

At block 914, metallization steps may be performed to form a sidewall ohmic contact and a bottom Schottky contact simultaneously.

Figure 10:
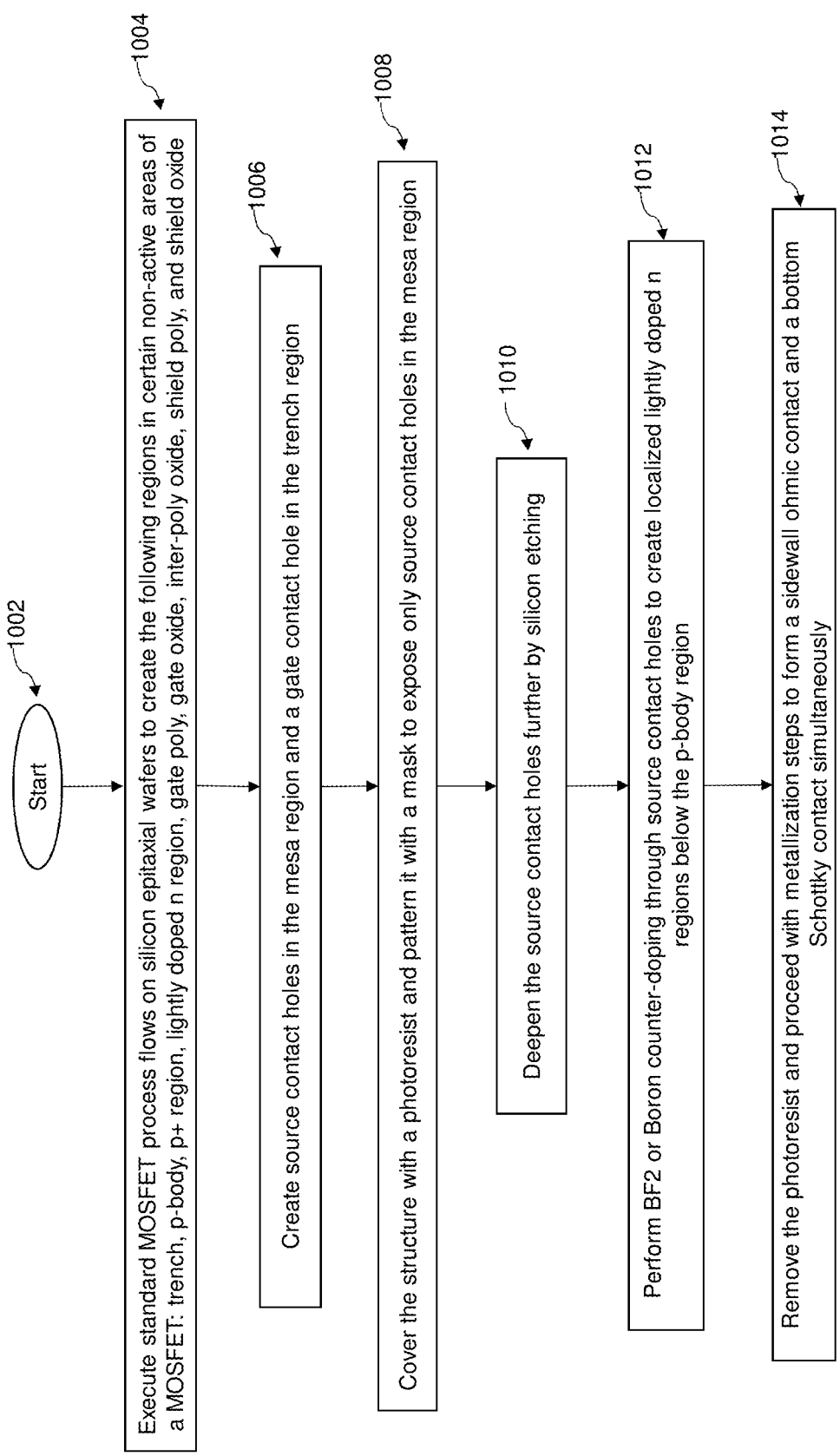
FIG. 10 is a flowchart illustrating an example method of integrating a third structure of a Schottky barrier diode shown in FIG. 4 according to an embodiment of the present disclosure.

FIG. 10 is a flowchart illustrating an example method of making the Schottky barrier diode according to the third structure of a shown in FIG. 7 according to an embodiment.

In one example, after starting at block 1002, the process may proceed to the block 1004 where standard MOSFET process flows may be executed on silicon epitaxial wafers to create the following regions in certain non-active areas of a MOSFET: trench, p-body, p+ region, lightly doped n region, gate poly, gate oxide, inter-poly oxide, shield poly, and shield oxide, as described with respect to FIG. 7. After that the process proceeds to block 1006.

At block 1006, the source contact holes may be created in the mesa region and a gate contact hole may be created in the trench region, after which the process proceeds to block 1008.

At 1008, the structure may be covered with a photoresist and patterned with a mask to expose only source contact holes in the mesa region, after which the process proceeds to block 1010.

At block 1010, the source contact holes may be deepen further by silicon etching, after which the process proceeds to block 1012.

At block 1012, BF2 or Boron counter-doping may be performed through source contact holes to create localized lightly doped n regions below the p-body region, after which the process proceeds to block 1014.

At block 1014, the photoresist may be removed to proceed with metallization steps to form a sidewall ohmic contact and a bottom Schottky contact simultaneously.

Although the present embodiments have been particularly described with reference to preferred examples thereof, it should be readily apparent to those of ordinary skill in the art that changes and modifications in the form and details may be made without departing from the spirit and scope of the present disclosure. It is intended that the appended claims encompass such changes and modifications.

What is claimed is:

1. An insulated gate semiconductor device comprising:
   a semiconductor substrate;
   an active area on the substrate, the active area further comprising an active cell configured to function as a transistor; and
   a non-active area on the substrate comprising a termination region, a shield tie region, a gate finger region, and a gate finger neighboring region, the non-active area further comprising a semiconductor cell configured to function as a Schottky barrier diode.

2. The device according to claim 1 wherein, the active cell further comprises
   a drain region of a first conductivity type on the substrate;
   an epitaxial layer of the first conductivity type grown on the drain region;
   a body region of a second conductivity type formed in the epitaxial layer;
   a semiconductor layer of the first conductivity type on the epitaxial layer;
   a trench source region having sidewalls and a bottom;
   localized doped regions of first conductivity type underneath the source regions; and
   a trench gate region having sidewalls and a bottom.

3. The device according to claim 1, wherein the semiconductor cell is in the termination region of the non-active area.

4. The device according to claim 1, wherein the semiconductor cell is in the shield tie region of the non-active area.

5. The device according to claim 1, wherein the semiconductor cell is in the gate finger neighboring region of the non-active area.

6. The device according to claim 3, wherein the semiconductor cell has a first structure comprising:
   a drain region of a first conductivity type on the substrate;
   an epitaxial layer of the first conductivity type grown on the substrate;
   a body region of a second conductivity type having a major surface formed in the epitaxial layer;
   a first trench source region having sidewalls and a bottom extending from the major surface into the epitaxial layer;
   a first localized doped region of the second conductivity type surrounding the first trench source region;
   a second localized doped region of the first conductivity type underneath the first trench source region;
   a second trench source region having sidewalls and a bottom extending from the major surface into the epitaxial layer;

a third localized doped region of the second conductivity type surrounding the second trench source region;
a fourth localized doped region of the first conductivity type underneath the second trench source region;
a shield region extending from a level below the major surface in the body region into the epitaxial layer; and
a third trench source region having sidewalls and a bottom extending from the major surface into the shield region,
wherein the first and the second trench source regions are covered with a layer of conductive material covering the side walls and the bottom to form an ohmic contact on the sidewalls and a Schottky contact with the second and the fourth localized doped regions respectively.

7. The device according to claim 4, wherein the semiconductor cell has a first structure comprising:
a drain region of a first conductivity type on the substrate;
an epitaxial layer of the first conductivity type grown on the substrate;
a body region of a second conductivity type having a major surface formed in the epitaxial layer;
a first trench source region having sidewalls and a bottom extending from the major surface into the epitaxial layer;
a first localized doped region of the second conductivity type surrounding the first trench source region;
a second localized doped region of the first conductivity type underneath the first trench source region;
a second trench source region having sidewalls and a bottom extending from the major surface into the epitaxial layer;
a third localized doped region of the second conductivity type surrounding the second trench source region;
a fourth localized doped region of the first conductivity type underneath the second trench source region;
a shield region extending from a level below the major surface in the body region into the epitaxial layer; and
a third trench source region having sidewalls and a bottom extending from the major surface into the shield region,
wherein the first and the second trench source regions are covered with a layer of conductive material covering the side walls and the bottom to form an ohmic contact on the sidewalls and a Schottky contact with the second and the fourth localized doped regions respectively.

8. The device according to claim 3, wherein the semiconductor cell has a second structure comprising:
a drain region of a first conductivity type on the substrate;
an epitaxial layer of the first conductivity type grown on the substrate;
a body region of a second conductivity type having a major surface formed in the epitaxial layer;
a first trench source region having sidewalls and a bottom extending from the major surface into the epitaxial layer;
a first localized doped region of the second conductivity type surrounding the first trench source region;
a second localized doped region of the first conductivity type underneath the first trench source region;
a second trench source region having sidewalls and a bottom extending from the major surface into the epitaxial layer;
a third localized doped region of the second conductivity type surrounding the second trench source region;
a fourth localized doped region of the first conductivity type underneath the second trench source region;
a shield region recessed in the epitaxial layer; and
a third trench source region having sidewalls and a bottom extending from the major surface into the shield region,
wherein the first and the second trench source regions are covered with a layer of conductive material covering the side walls and the bottom to form an ohmic contact on the sidewalls and a Schottky contact with the second and the fourth localized doped regions respectively.

9. The device according to claim 5, wherein the semiconductor cell has a third structure comprising:
a drain region of a first conductivity type on the substrate;
an epitaxial layer of the first conductivity type grown on the substrate;
a body region of a second conductivity type having a major surface formed in the epitaxial layer;
a first trench source region having sidewalls and a bottom extending from the major surface into the epitaxial layer;
a first localized doped region of the second conductivity type surrounding the first trench source region;
a second localized doped region of the first conductivity type underneath the first trench source region;
a second trench source region having sidewalls and a bottom extending from the major surface into the epitaxial layer;
a third localized doped region of the second conductivity type surrounding the second trench source region;
a fourth localized doped region of the first conductivity type underneath the second trench source region;
a trench gate region extending from a level below the major surface in the body region into the epitaxial layer;
a shield region below the gate region; and
a gate terminal having sidewalls and a bottom extending from the major surface into the gate region,
wherein the trench gate region, the first trench source region, and the second trench source region are covered with a layer of conductive material covering the side walls and the bottom, and
wherein the layer of conductive material in the first and the second trench source region forms an ohmic contact on the sidewalls and a Schottky contact with the second and the fourth localized doped regions respectively.

10. The device according to claim 1, wherein the semiconductor cell is in the termination region and the shield tie region and the gate finger neighboring region of the non-active area.

11. A method for fabricating an insulated gate semiconductor device comprising:
a semiconductor substrate;
active areas on the substrate, non-active areas on the substrate, the active area further comprising an active cell configured to function as a transistor, the non-active area further comprising:
a termination region, a shield tie region, a gate finger region, and a gate finger neighboring region, the method comprising:
integrating a semiconductor cell configured to function as a Schottky barrier diode in the non-active area and over the shield region.

12. The method according to claim 11, further comprising integrating the semiconductor cell in the termination region or the shield tie region or the gate finger neighboring region of the non-active area.

13. The method according to claim 12, wherein the method further comprises integrating a semiconductor cell having a first structure in the termination region or the shield tie region.

14. The method according to claim 12, wherein the method further comprises integrating a semiconductor cell having second structure in the termination region.

15. The method according to claim 12, wherein the method further comprises integrating a semiconductor cell having a third structure in the gate finger neighboring region.

16. The method according to claim 13, wherein the semiconductor cell further comprises,
a drain region of a first conductivity type on the substrate,
an epitaxial layer of the first conductivity type grown on the substrate,
a body region of a second conductivity type having a major surface formed in the epitaxial layer,
a first trench source region having sidewalls and a bottom extending from the major surface into the body region,
a first localized doped region of the second conductivity type surrounding the first trench source region,
a second trench source region having sidewalls and a bottom extending from the major surface into the body region,
a third localized doped region of the second conductivity type surrounding the second trench source region,
the shield region extending from a level below the major surface in the body region into the epitaxial layer,
a third trench source region having sidewalls and a bottom extending from the major surface into the shield region,
wherein the method further comprises:
placing and patterning a photoresist to selective cover the third trench source region,
deepening by etching the first and the second trench source regions into the epitaxial layer,
creating a second localized doped region of the first conductivity type underneath the first trench source region,
creating a fourth localized doped region of the first conductivity type underneath the second trench source region,
removing the photoresist, and
filling the first, second, and the third trench source regions with a conductive material.

17. The device according to claim 14, wherein the semiconductor cell comprises,
a drain region of a first conductivity type on the substrate,
an epitaxial layer of the first conductivity type grown on the substrate,
a body region of a second conductivity type having a major surface formed in the epitaxial layer,
a first trench source region having sidewalls and a bottom extending from the major surface into the epitaxial layer,
a first localized doped region of the second conductivity type surrounding the first trench source region,
a second trench source region having sidewalls and a bottom extending from the major surface into the epitaxial layer,
a third localized doped region of the second conductivity type surrounding the second trench source region,
a shield region recessed in the epitaxial layer,
a third trench source region having sidewalls and a bottom extending from the major surface into the shield region,
wherein the method further comprises:
deepening by etching the first and the second trench source regions into the epitaxial layer,
creating a second localized doped region of the first conductivity type underneath the first trench source region,
creating a fourth localized doped region of the first conductivity type underneath the second trench source region,
deepening by etching the third trench source region into the shield region, and
filling the first, second, and the third trench source regions with a conductive material.

18. The method according to claim 15, wherein the semiconductor cell comprises,
a drain region of a first conductivity type on the substrate,
an epitaxial layer of the first conductivity type grown on the substrate,
a body region of a second conductivity type having a major surface formed in the epitaxial layer,
a first trench source region having sidewalls and a bottom extending from the major surface into the epitaxial layer,
a first localized doped region of the second conductivity type surrounding the first trench source region,
a second trench source region having sidewalls and a bottom extending from the major surface into the epitaxial layer,
a third localized doped region of the second conductivity type surrounding the second trench source region,
a trench gate region extending from a level below the major surface in the body region into the epitaxial layer,
a shield region below the gate region,
a gate terminal having sidewalls and a bottom extending from the major surface into the gate region,
wherein the method further comprises;
placing and patterning a photoresist to selective cover the trench gate region,
deepening by etching the first and the second trench source regions into the epitaxial layer,
creating a second localized doped region of the first conductivity type underneath the first trench source region,
creating a fourth localized doped region of the first conductivity type underneath the second trench source region, and
filling the first trench source region, the second trench source region, and the trench gate region with a conductive material.

19. The method according to claim 16, where the method further comprises:
counter-doping the epitaxial layer with difluoroborane or Boron to creating the second and fourth localized regions to have a lower doping concentration than the epitaxial layer.

20. The method according to claim 17, where the method further comprises:
counter-doping the epitaxial layer with difluoroborane or Boron to creating the second and fourth localized regions to have a lower doping concentration than the epitaxial layer.

21. The method according to claim 18, where the method further comprises:
counter-doping the epitaxial layer with difluoroborane or Boron to creating the second and fourth localized regions to have a lower doping concentration than the epitaxial layer.

22. The method according to claim 11, further comprising integrating the semiconductor cell in the termination region and the shield tie region and the gate finger neighboring region of the non-active area.

* * * * *